(12) United States Patent
Lin et al.

(10) Patent No.: US 8,241,952 B2
(45) Date of Patent: Aug. 14, 2012

(54) SEMICONDUCTOR DEVICE AND METHOD OF FORMING IPD IN FAN-OUT LEVEL CHIP SCALE PACKAGE

(75) Inventors: Yaojian Lin, Piscataway (SG); Robert C. Frye, Piscataway, NJ (US); Pandi Chelvam Marimuthu, Singapore (SG); Kai Liu, Pheonix, AZ (US)

(73) Assignee: STATS ChipPAC, Ltd., Singapore (SG)

( * ) Notice: Subject to any disclaimer, the term of this patent is extended or adjusted under 35 U.S.C. 154(b) by 175 days.

(21) Appl. No.: 12/713,018

(22) Filed: Feb. 25, 2010

(65) Prior Publication Data

US 2011/0204509 A1 Aug. 25, 2011

(51) Int. Cl.
*H01L 21/44* (2006.01)
*H01L 21/48* (2006.01)
*H01L 21/50* (2006.01)

(52) U.S. Cl. ........................................ 438/106; 438/109
(58) Field of Classification Search .......... 438/106–124; 257/E23.06, E23.051
See application file for complete search history.

(56) References Cited

U.S. PATENT DOCUMENTS

| | | | |
|---|---|---|---|
| 5,250,843 | A | 10/1993 | Eichelberger |
| 5,353,498 | A | 10/1994 | Fillion et al. |
| 5,841,193 | A | 11/1998 | Eichelberger |
| 7,619,901 | B2 | 11/2009 | Eichelberger et al. |
| 2008/0308917 | A1 | 12/2008 | Pressel et al. |
| 2009/0072388 | A1 | 3/2009 | Tews et al. |
| 2009/0072411 | A1 | 3/2009 | Tews et al. |
| 2009/0213561 | A1* | 8/2009 | Mi et al. ........................ 361/782 |

* cited by examiner

*Primary Examiner* — Cuong Q Nguyen
(74) *Attorney, Agent, or Firm* — Robert D. Atkins; Patent Law Group: Atkins & Associates, P.C.

(57) ABSTRACT

A semiconductor wafer contains semiconductor die. A first conductive layer is formed over the die. A resistive layer is formed over the die and first conductive layer. A first insulating layer is formed over the die and resistive layer. The wafer is singulated to separate the die. The die is mounted to a temporary carrier. An encapsulant is deposited over the die and carrier. The carrier and a portion of the encapsulant and first insulating layer is removed. A second insulating layer is formed over the encapsulant and first insulating layer. A second conductive layer is formed over the first and second insulating layers. A third insulating layer is formed over the second insulating layer and second conductive layer. A third conductive layer is formed over the third insulating layer and second conductive layer. A fourth insulating layer is formed over the third insulating layer and third conductive layer.

19 Claims, 13 Drawing Sheets

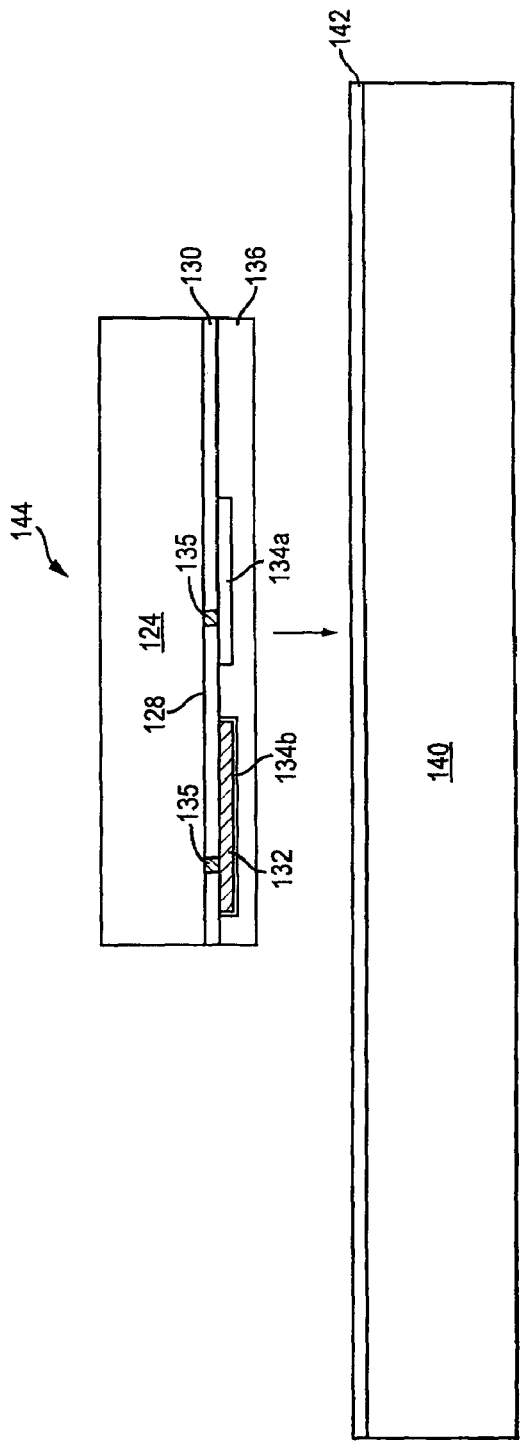
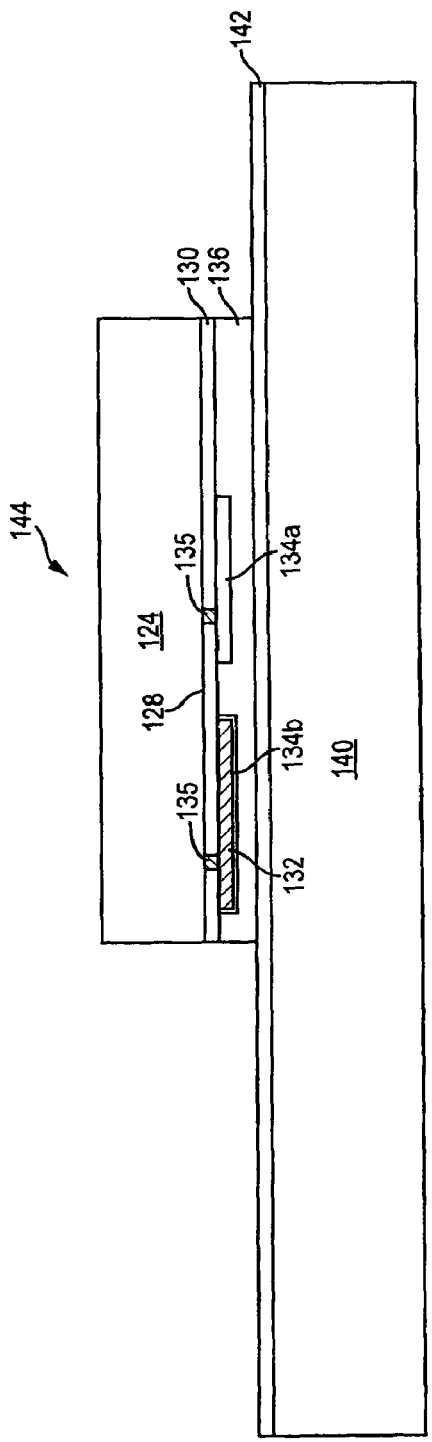

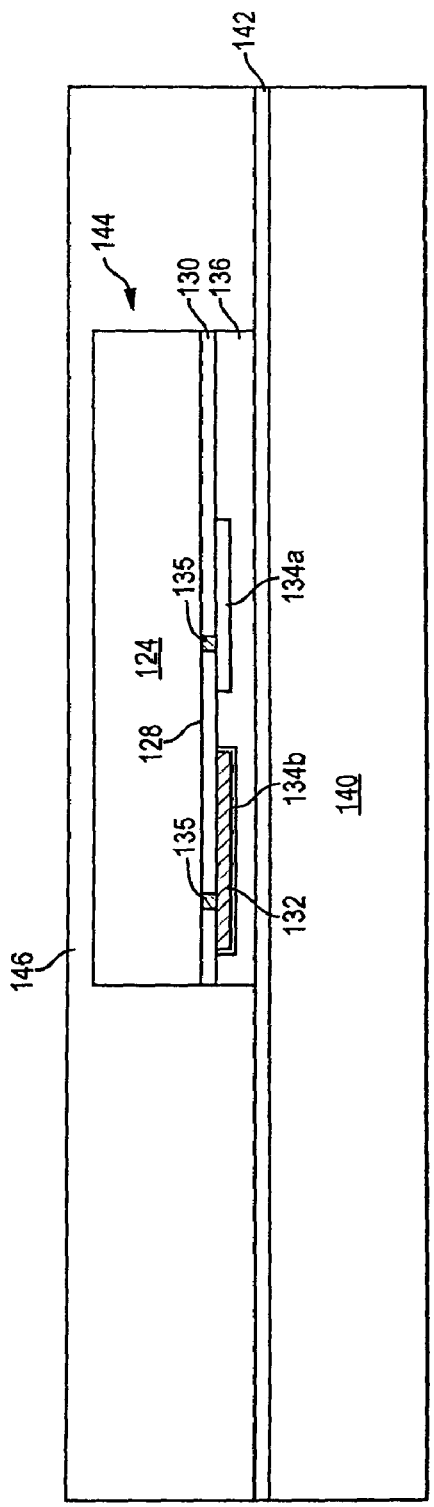
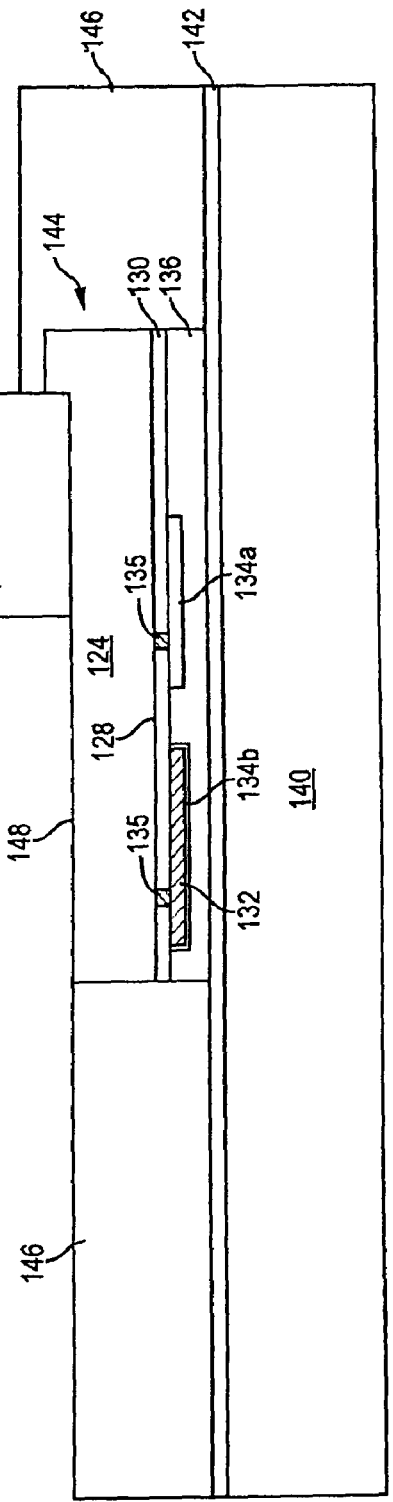
FIG. 3g
FIG. 3h

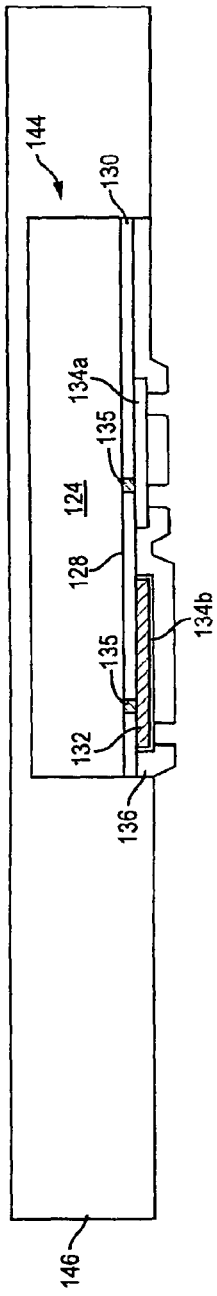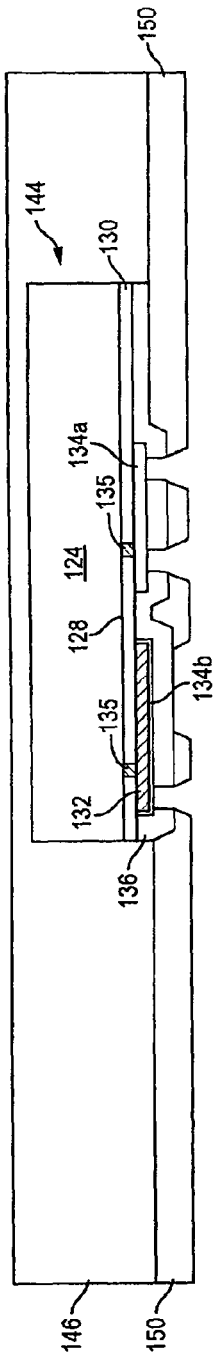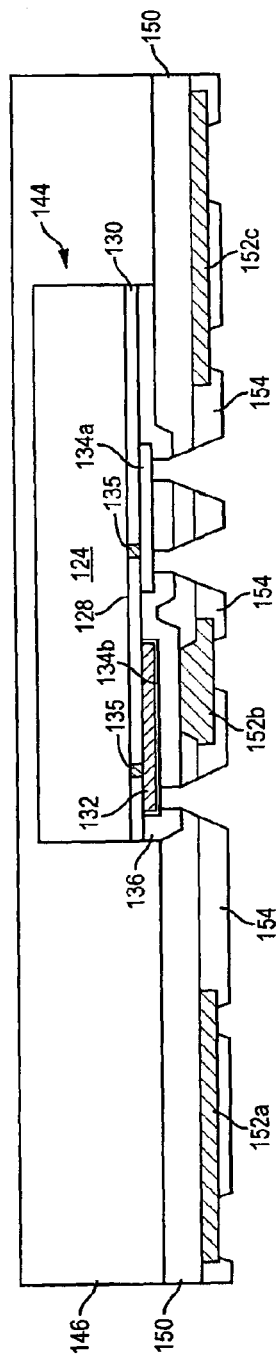

SEMICONDUCTOR DEVICE AND METHOD OF FORMING IPD IN FAN-OUT LEVEL CHIP SCALE PACKAGE

FIELD OF THE INVENTION

The present invention relates in general to semiconductor devices and, more particularly, to a semiconductor device and method of forming an integrated passive device (IPD) in a fan-out wafer level chip scale package (FO-WLCSP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

The IPDs are commonly formed external to the die within an interconnect structure of the package over a temporary carrier for structural support. The fully fabricated external IPD and die has a high cost. Adhesion problems have been found in the IPD passivation over the temporary carrier. In addition, the IPDs require more vertical space than the baseband semiconductor die and therefore impose a high aspect ratio gap between side-by-side IPD die and baseband die.

SUMMARY OF THE INVENTION

A need exists to simplify the manufacturing process and reduce cost in forming IPDs. Accordingly, in one embodiment, the present invention is a method of manufacturing a semiconductor device comprising the steps of providing a semiconductor wafer containing a plurality of semiconductor die, forming a first conductive layer over the semiconductor die, forming a resistive layer over the semiconductor die and the first conductive layer, forming a first insulating layer over the semiconductor die and resistive layer, singulating the semiconductor wafer to separate the semiconductor die, mounting the semiconductor die to a temporary carrier, depositing an encapsulant over the semiconductor die and temporary carrier, removing the temporary carrier and a portion of the encapsulant and first insulating layer, forming a second insulating layer over the encapsulant and first insulating layer, forming a second conductive layer over the first insulating layer and second insulating layer, forming a third insulating layer over the second insulating layer and second conductive layer, forming a third conductive layer over the third insulating layer and second conductive layer, and forming a fourth insulating layer over the third insulating layer and third conductive layer.

In another embodiment, the present invention is a method of manufacturing a semiconductor device comprising the steps of providing a semiconductor wafer containing a plurality of semiconductor die, forming a capacitor over the semiconductor die, singulating the semiconductor wafer to separate the semiconductor die, mounting the semiconductor die to a carrier, depositing an encapsulant over the semiconductor die and carrier, removing the carrier, forming a first insulating layer over the encapsulant and semiconductor die, forming a first conductive layer over the first insulating layer and capacitor, forming a second insulating layer over the first insulating layer and first conductive layer, forming a second conductive layer over the second insulating layer and first conductive layer, and forming a third insulating layer over the second insulating layer and second conductive layer.

In another embodiment, the present invention is a method of manufacturing a semiconductor device comprising the steps of providing a semiconductor die, forming a capacitor over the semiconductor die, depositing an encapsulant over the semiconductor die, and forming an interconnect structure over the encapsulant and semiconductor die. The interconnect structure includes an inductor formed a predetermined distance away from a footprint of the semiconductor die.

In another embodiment, the present invention is a semiconductor device comprising a semiconductor die and capacitor formed over the semiconductor die. An encapsulant is deposited over the semiconductor die. An interconnect structure is formed over the encapsulant and semiconductor die. The interconnect structure includes an inductor formed a predetermined distance away from a footprint of the semiconductor die.

DETAILED DESCRIPTION OF THE DRAWINGS

Figure 1:
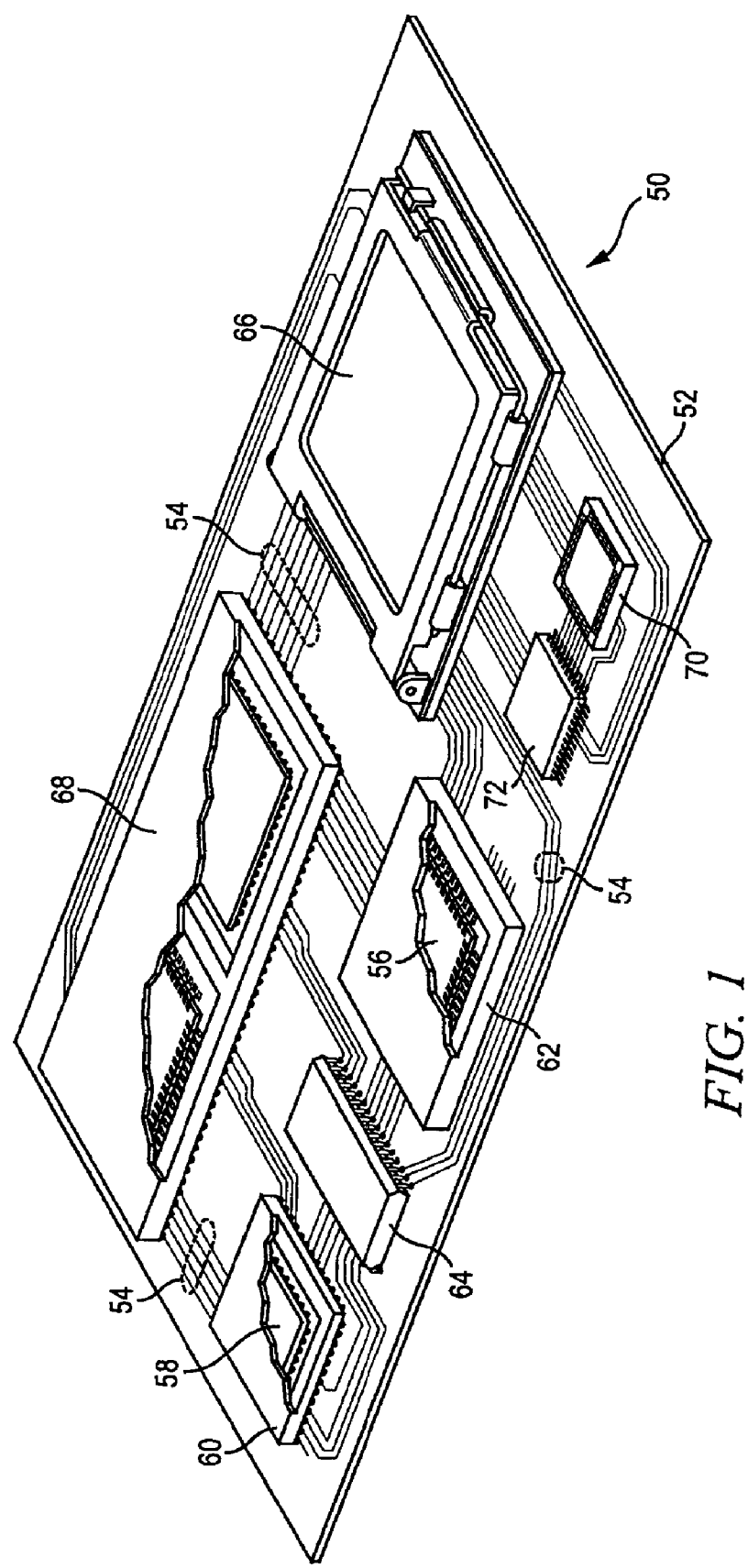
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer.

The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
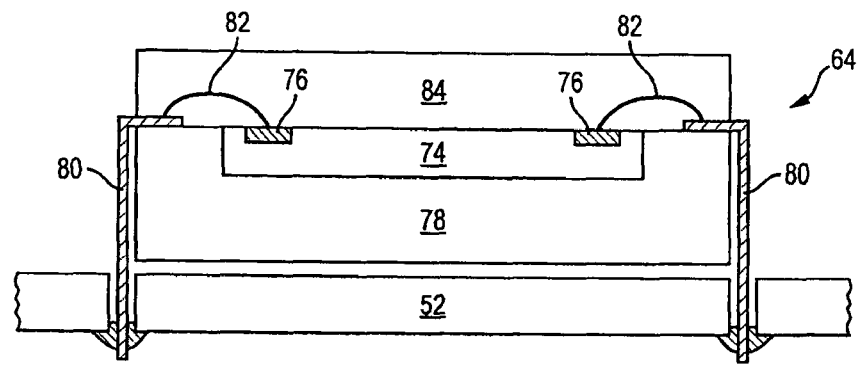
FIGS. 2a-2c illustrate further detail of the semiconductor packages mounted to the PCB.
Figure 2B:
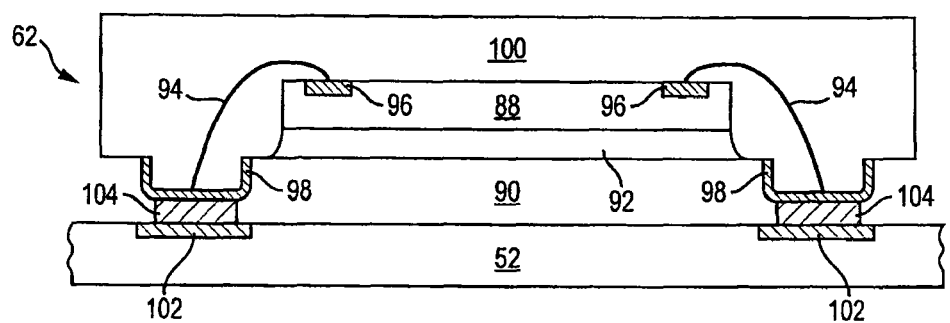
Figure 2C:
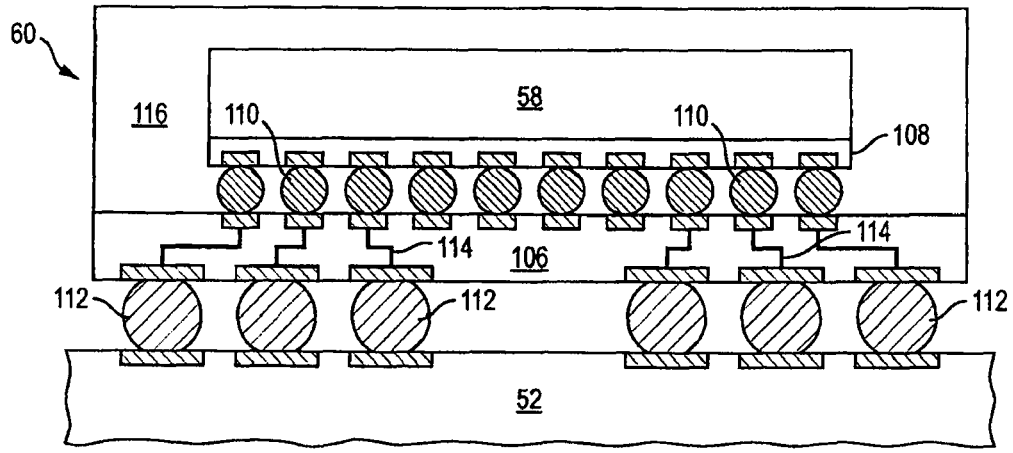

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
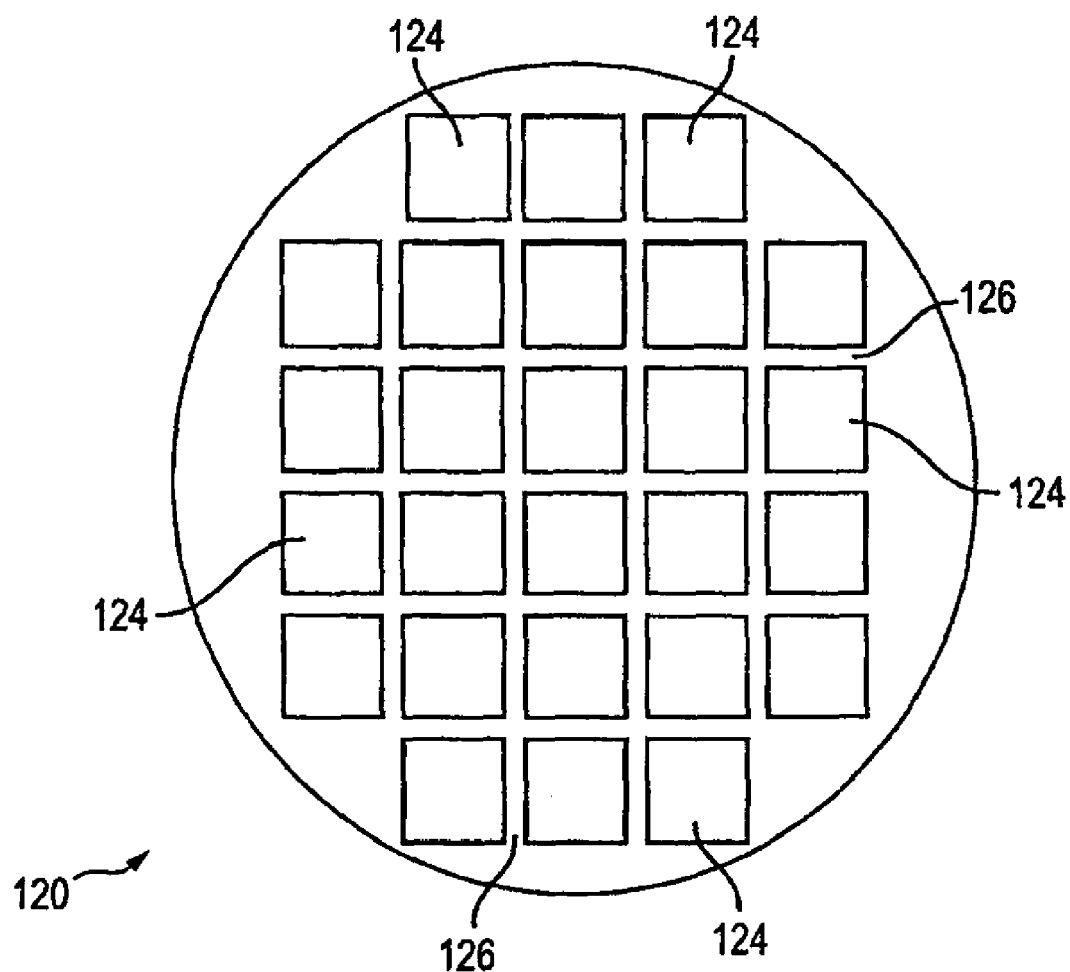
FIGS. 3a-3n illustrate a process of forming an IPD in a FO-WLCSP.
Figure 3B:
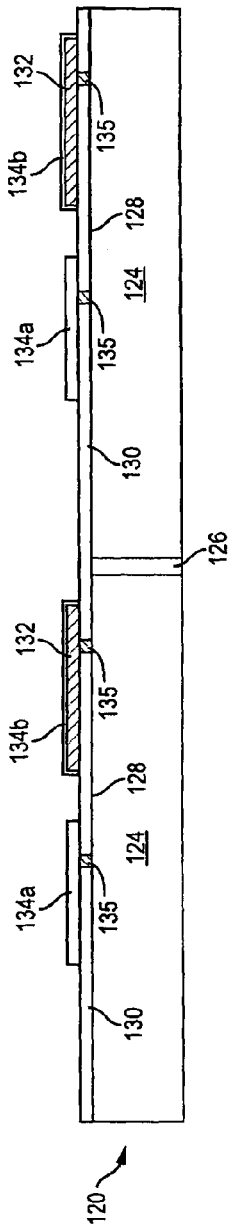
Figure 3C:
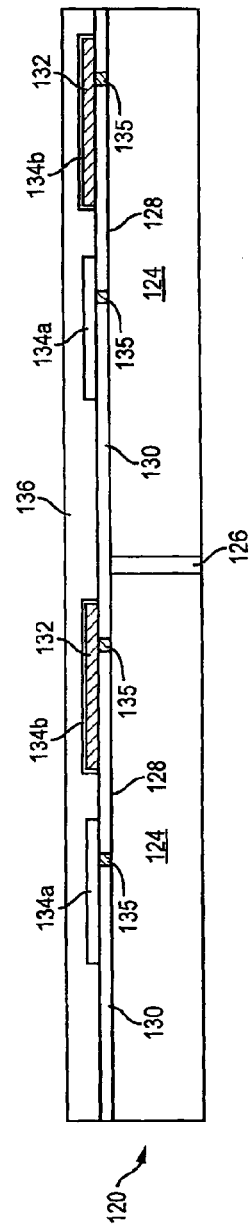
Figure 3D:
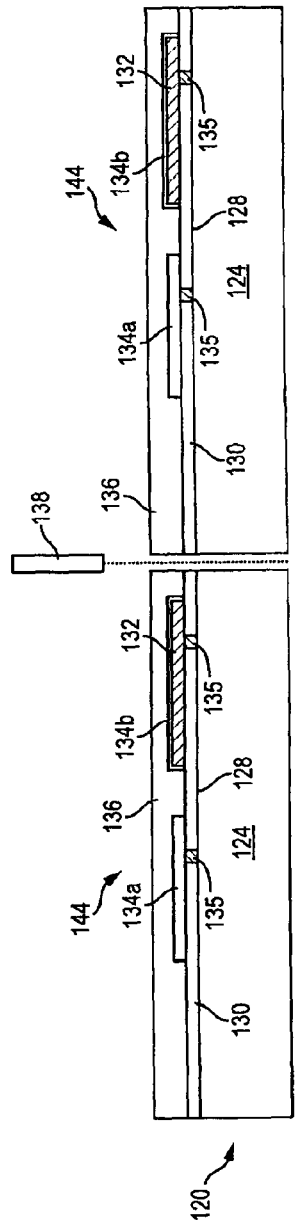
Figure 3L:
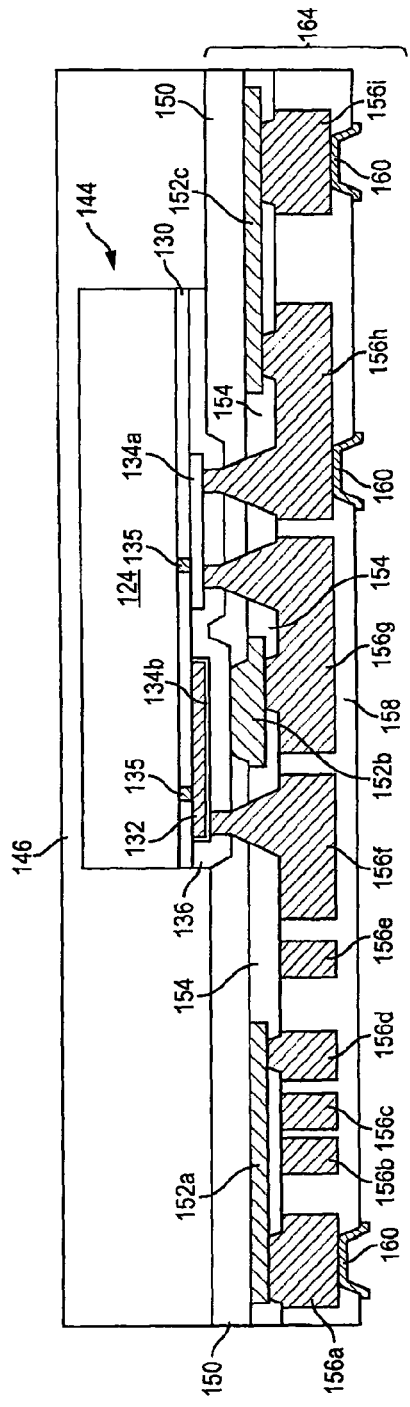
Figure 3M:
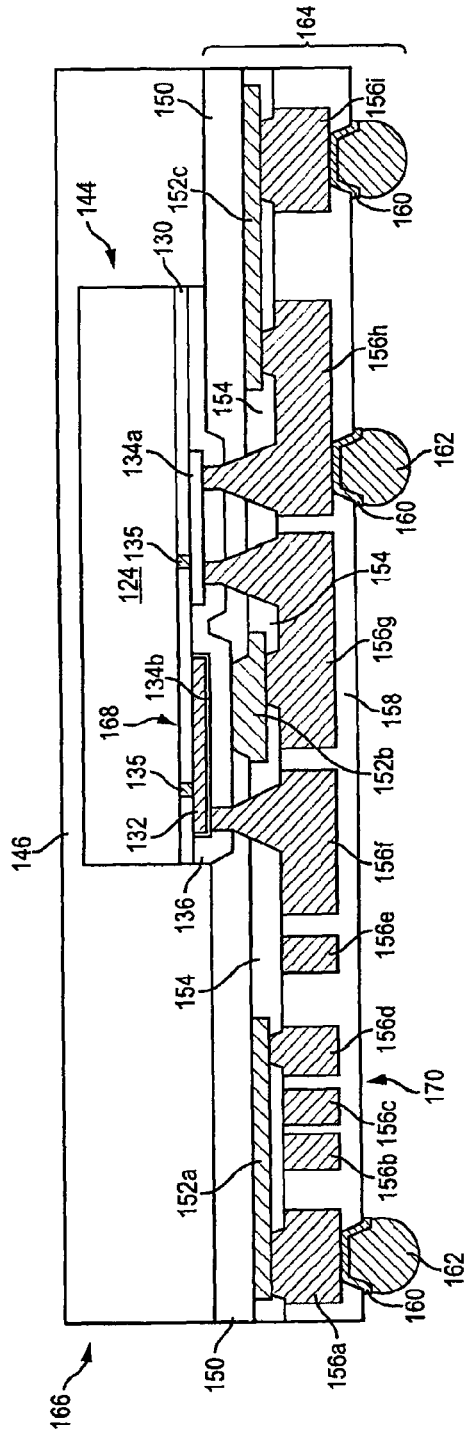
Figure 3N:
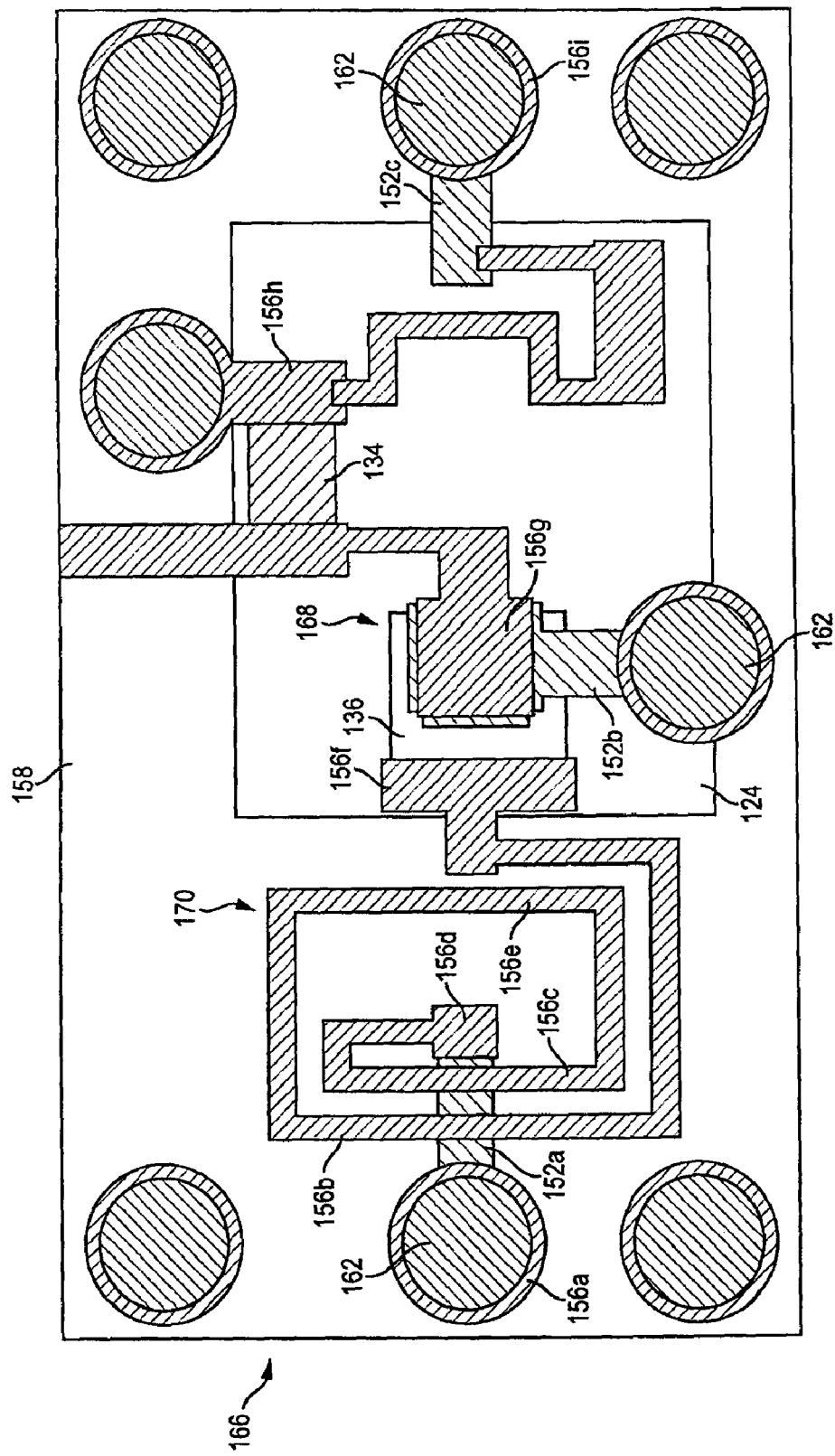

FIGS. 3a-3n illustrate, in relation to FIGS. 1 and 2a-2c, a process of forming an IPD structure over a semiconductor die. FIG. 3a shows a semiconductor wafer 120 with a base substrate material, such as silicon, germanium, gallium arsenide, indium phosphide, or silicon carbide, for structural support. A plurality of semiconductor die or components 124 is formed on wafer 120 separated by saw streets 126 as described above.

FIG. 3b shows a cross-sectional view of a portion of semiconductor wafer 120. Each semiconductor die 124 has an active surface 128 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An insulating or dielectric layer 130 is formed over active surface 128 of semiconductor die 124 using PVD, CVD, printing, spin coating, spray coating, or thermal oxidation. The insulating layer 130 can be one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable dielectric material. In one embodiment, insulating layer 130 is a thermal oxide. The insulating layer 130 serves to planarize the surface of semiconductor wafer 120 to improve step coverage of subsequent deposition and lithography processing steps. An optional conductive via 135 can be formed through insulating layer 130.

An electrically conductive layer 132 is formed over insulating layer 130 using patterning and PVD, CVD, sputtering, electrolytic plating, electroless plating process, or other suitable metal deposition process. Conductive layer 132 can be one or more layers of Al, Cu, Sn, Ni, Au, Ag, or other suitable electrically conductive material.

An optional resistive layer 134 is formed over insulating layer 130 and conductive layer 132 using PVD, CVD, or other suitable deposition process. Resistive layer 134a is formed over insulating layer 130, and resistive layer 134b is formed over conductive layer 132. In one embodiment, resistive layer 134 can be tantalum silicide (TaxSiy) or other metal silicides, TaN, nickel chromium (NiCr), titanium (Ti), titanium nitride (TiN), titanium tungsten (TiW), or doped poly-silicon having a resistivity between 5 and 100 ohm/sq. Conductive layer 132 and resistive layer 134a are electrically connected through conductive vias 135 to the circuits on active surface 128 of semiconductor die 124.

In FIG. 3c, an insulating or dielectric layer 136 is formed over the entire active surface 128, including insulating layer 130 and resistive layer 134, using patterning and PVD, CVD, printing, spin coating, spray coating, or thermal oxidation. The insulating layer 136 can be one or more layers of SiO2, Si3N4, SiON, Ta2O5, Al2O3, polyimide, BCB, PBO, or other suitable dielectric material.

In FIG. 3d, semiconductor wafer 120 is singulated with saw blade or laser cutting tool 138 into individual semiconductor die 144.

In FIG. 3e, a substrate or carrier 140 contains temporary or sacrificial base material such as silicon, polymer, polymer composite, metal, ceramic, glass, glass epoxy, beryllium oxide, or other suitable low-cost, rigid material for structural support. An optional interface layer 142 can be formed over carrier 140 as a temporary double-sided adhesive tape or bonding film. Using a pick and place operation, and leading with insulating layer 136, the assembly 144 described in FIGS. 3a-3d is mounted to carrier 140, as shown in FIGS. 3e-3f.

FIG. 3g shows an encapsulant or molding compound 146 deposited over semiconductor die 124 and carrier 140 using a paste printing, compressive molding, transfer molding, liquid encapsulant molding, vacuum lamination, or other suitable applicator. Encapsulant 146 can be polymer composite material, such as epoxy resin with filler, epoxy acrylate with filler, or polymer with proper filler. Encapsulant 146 is non-conductive and environmentally protects the semiconductor device from external elements and contaminants.

FIG. 3h shows an optional step with grinder 147 removing a portion of encapsulant 146 and bulk material from back surface 148 of semiconductor die 124, opposite active surface 128. The back surface 148 of semiconductor die 124 is coplanar with a top surface of encapsulant 146 following the optional grinding process.

Continuing from FIG. 3g, carrier 140 and interface layer 142 are removed by chemical etching, mechanical peel-off, CMP, mechanical grinding, thermal bake, laser scanning, or wet stripping. The removal process further takes away a portion of insulating layer 130 and encapsulant 146, as shown in FIG. 3i.

In a first photolithographic process, an insulating or passivation layer 150 is formed over insulating layer 136 and encapsulant 146 by PVD, CVD, printing, spin coating, spray coating, or thermal oxidation, as shown in FIG. 3j. The insulating layer 150 can be one or more layers of SiO2, Si3N4, SiON, Ta2O5, Al2O3, or other material having suitable insulating properties. In one embodiment, insulating layer 150 is a polymer dielectric. The insulating layer 150 is patterned with a portion of the insulating layer being removed by an etching process to expose insulating layer 136 and resistive layer 134a and 134b. The insulating layer 150 can be used as a mask for subsequent processing steps.

In FIG. 3k, an electrically conductive layer 152 is formed over insulating layer 136 and insulating layer 150 using patterning and PVD, CVD, sputtering, electrolytic plating, electroless plating process, or other suitable metal deposition process to form individual portions or sections 152a-152c. Conductive layer 152 can be one or more layers of Al, Cu, Sn, Ni, Au, Ag, or other suitable electrically conductive material. The individual portions of conductive layer 152a-152c can be electrically common or electrically isolated depending on the connectivity of the individual semiconductor die.

In a second photolithographic process, an insulating or passivation layer 154 is formed over insulating layer 150 and conductive layer 152 using patterning and PVD, CVD, printing, spin coating, spray coating, or thermal oxidation. The insulating layer 154 can be one or more layers of SiO2, Si3N4, SiON, Ta2O5, Al2O3, or other material having suitable insulating properties. In one embodiment, insulating layer 154 is a polymer dielectric. The insulating layer 154 is patterned with a portion of the insulating layer being removed by an etching process to expose conductive layer 152, and optionally form vias to expose resistive layer 134a and 134b.

In FIG. 3l, an electrically conductive layer 156 is formed over conductive layer 152, insulating layer 154, and resistive layer 134 using patterning and PVD, CVD, sputtering, electrolytic plating, electroless plating process, or other suitable metal deposition process to form individual portions or sections 156a-156i. Conductive layer 156 can be one or more layers of Al, Cu, Sn, Ni, Au, Ag, or other suitable electrically conductive material. The individual portions of conductive layer 156a-156i can be electrically common or electrically isolated depending on the connectivity of the individual semiconductor die.

In a third photolithographic process, an insulating or passivation layer 158 is formed over insulating layer 154 and conductive layer 156 using spin coating, PVD, CVD, printing, sintering, or thermal oxidation. The insulating layer 158 can be one or more layers of SiO2, Si3N4, SiON, Ta2O5, Al2O3, or other material having suitable insulating properties. In one embodiment, insulating layer 158 is a polymer dielectric. The insulating layer 158 is patterned with a portion of the insulating layer being removed by an etching process to expose conductive layer 156a, 156h, and 156i.

An optional electrically conductive layer 160 is formed over conductive layer 156a, 156h, and 156i using PVD, CVD, sputtering, electrolytic plating, electroless plating process, or other suitable metal deposition process. Conductive layer 160 can be one or more layers of Ti, TiW, NiV, Cr, CrCu, Al, Cu, Sn, Ni, Au, Ag, or other suitable electrically conductive material. In one embodiment, conductive layer 160 is an under bump metallization (UBM) containing a multi-layer metal stack with an adhesion layer, barrier layer, and seed or wetting layer. The adhesion layer is formed over conductive layer 156a, 156h, and 156i and can be Ti, TiN, TiW, Al, or chromium (Cr). The barrier layer is formed over the adhesion layer and can be made of Ni, nickel vanadium (NiV), platinum (Pt), palladium (Pd), TiW, or chromium copper (CrCu). The barrier layer inhibits the diffusion of Cu into the active area of the die. The seed layer can be Cu, Ni, NiV, Au, or Al. The seed layer is formed over the barrier layer and acts as an intermediate conductive layer between conductive layer 156a, 156h, and 156i and subsequent solder bumps or other interconnect structure. UBM 160 provides a low resistive interconnect to conductive layer 156a, 156h, and 156i, as well as a barrier to solder diffusion and seed layer for solder wettability.

In FIG. 3m, an electrically conductive bump material is deposited over UBM 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 160 using a suitable attachment or bonding process. In one embodiment, the bump material is reflowed by heating the material above its melting point to form spherical balls or bumps 162. In some applications, bumps 162 are reflowed a second time to improve electrical contact to UBM 160. The bumps can also be compression bonded to UBM 160. Bumps 162 represent one type of interconnect structure that can be formed over UBM 160. The interconnect structure can also use bond wires, stud bump, micro bump, or other electrical interconnect. Conductive layers 152 and 156, bumps 162, and insulating layers 150, 154, and 158 constitute a build-up interconnect structure 164 of FO-WLCSP 166.

The structures described in FIGS. 3i-3n constitute a plurality of passive circuit elements or IPDs. In one embodiment, conductive layer 156g and 152b, insulating layer 136, resistive layer 134b, and conductive layer 132 constitute a metal insulator metal (MIM) capacitor 168. Resistive layer 134a between conductive layer 156g and 156h is a resistor element in the passive circuit. The individual sections of conductive layer 156b-156e can be wound or coiled in plan-view to produce or exhibit the desired properties of an inductor 170. Conductive layer 156b-156e is formed at least 50 micrometers away from the footprint of semiconductor die 124 to reduce inter-device interference with MIM capacitor 168. FIG. 3n shows a bottom view of FO-WLCSP 166.

The IPD structures 168-170 provide electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

The IPD structure 168 formed over semiconductor die 124 simplifies the manufacturing process and reduces cost. The MIM capacitor 168 and resistor 134b are formed on semiconductor die 124 prior to depositing encapsulant 146. Other IPDs, such as inductor 170 are formed after encapsulation, which saves manufacturing cost by reducing the required number of lithography layers: one layer to etch back insulating layer 150 and form conductive layer 152, one layer to etch back insulating layer 154 and form conductive layer 156, and one layer to etch back insulating layer 158 and form bumps 162. In addition, by only forming MIM capacitor and resistor 134b on semiconductor die 124, and forming the aspect ratio of the gap between side-by-side IPD die and baseband die can be reduced, see FIG. 7.

Figure 4:
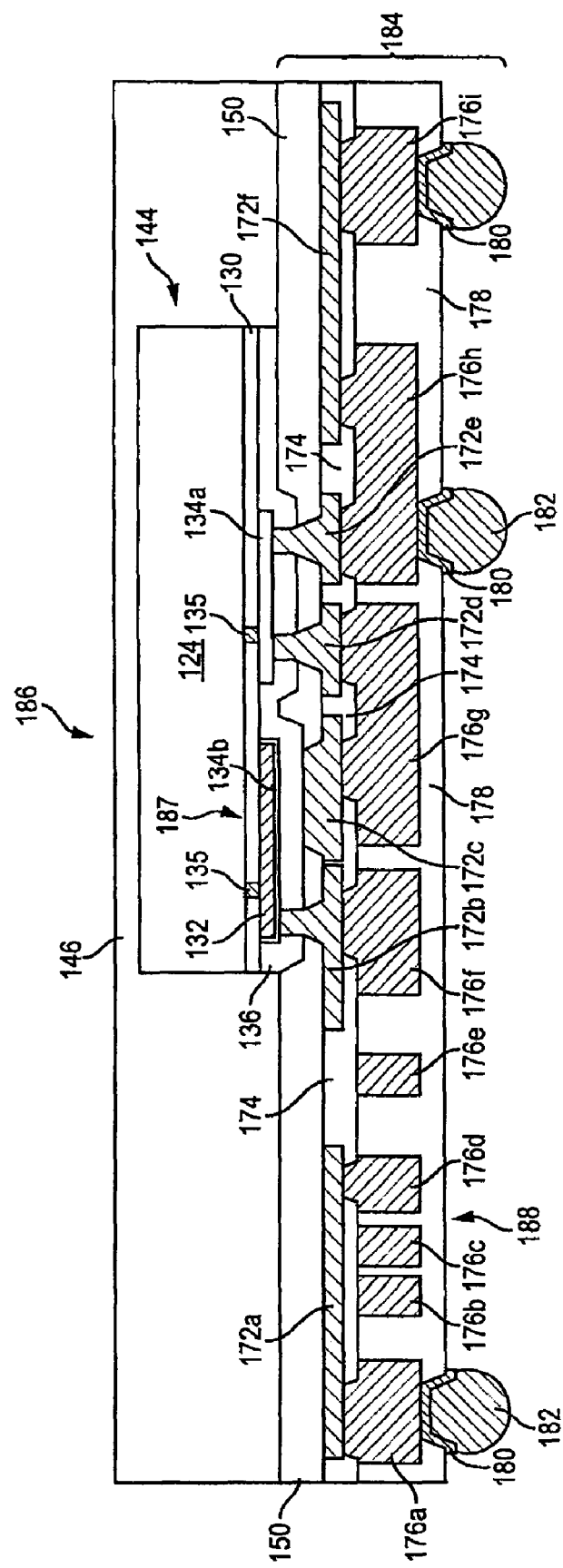
FIG. 4 illustrates another embodiment of the IPD formed in the FO-WLCSP.

FIG. 4 shows an alternate embodiment continuing from FIG. 3j, an electrically conductive layer 172 is formed over insulating layer 136 and insulating layer 150 using patterning and PVD, CVD, sputtering, electrolytic plating, electroless plating process, or other suitable metal deposition process to form individual portions or sections 172a-172f. Conductive layer 172 can be one or more layers of Al, Cu, Sn, Ni, Au, Ag, or other suitable electrically conductive material. The individual portions of conductive layer 172a-172f can be electrically common or electrically isolated depending on the connectivity of the individual semiconductor die. For example, conductive layer 172b is electrically connected to resistive layer 134b and conductive layer 172d-172e is electrically connected to resistive layer 134a.

An insulating or passivation layer 174 is formed over insulating layer 150 and conductive layer 172 using patterning and PVD, CVD, printing, spin coating, spray coating, or thermal oxidation. The insulating layer 174 can be one or more layers of SiO2, Si3N4, SiON, Ta2O5, Al2O3, or other material having suitable insulating properties. In one embodiment, insulating layer 174 is a polymer dielectric. The insulating layer 174 is patterned with a portion of the insulating layer being removed by an etching process to expose conductive layer 172.

An electrically conductive layer 176 is formed over conductive layer 172 and insulating layer 174 using patterning and PVD, CVD, sputtering, electrolytic plating, electroless plating process, or other suitable metal deposition process to form individual portions or sections 176a-176i. Conductive layer 176 can be one or more layers of Al, Cu, Sn, Ni, Au, Ag, or other suitable electrically conductive material. The individual portions of conductive layer 176a-176i can be electrically common or electrically isolated depending on the connectivity of the individual semiconductor die. For example, conductive layer 176a and 176d are electrically connected to conductive layer 172a, conductive layer 176f is electrically connected to conductive layer 172b, conductive layer 176g is electrically connected to conductive layer 172c-172d, conductive layer 176h is electrically connected to conductive layer 172e-172f, and conductive layer 176i is electrically connected to conductive layer 172f.

An insulating or passivation layer 178 is formed over insulating layer 174 and conductive layer 176 using spin coating, PVD, CVD, printing, sintering, or thermal oxidation. The insulating layer 178 can be one or more layers of SiO2, Si3N4, SiON, Ta2O5, Al2O3, or other material having suitable insulating properties. In one embodiment, insulating layer 178 is a polymer dielectric. The insulating layer 178 is patterned with a portion of the insulating layer being removed by an etching process to expose conductive layer 176a, 176h, and 176i.

An optional electrically conductive layer 180 is formed over conductive layer 176a, 176h, and 176i using PVD, CVD, sputtering, electrolytic plating, electroless plating process, or other suitable metal deposition process. Conductive layer 180 can be one or more layers of Ti, TiW, NiV, Cr, CrCu, Al, Cu, Sn, Ni, Au, Ag, or other suitable electrically conductive material. In one embodiment, conductive layer 180 is an UBM containing a multi-layer metal stack with an adhesion layer, barrier layer, and seed or wetting layer, similar to conductive layer 160.

An electrically conductive bump material is deposited over UBM 180 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 180 using a suitable attachment or bonding process. In one embodiment, the bump material is reflowed by heating the material above its melting point to form spherical balls or bumps 182. In some applications, bumps 182 are reflowed a second time to improve electrical contact to UBM 180. The bumps can also be compression bonded to UBM 180. Bumps 182 represent one type of interconnect structure that can be formed over UBM 180. The interconnect structure can also use bond wires, stud bump, micro bump, or other electrical interconnect. Conductive layers 172 and 176, bumps 182, and insulating layers 150, 174, and 178 constitute a build-up interconnect structure 184 of FO-WLCSP 186.

Figure 5:
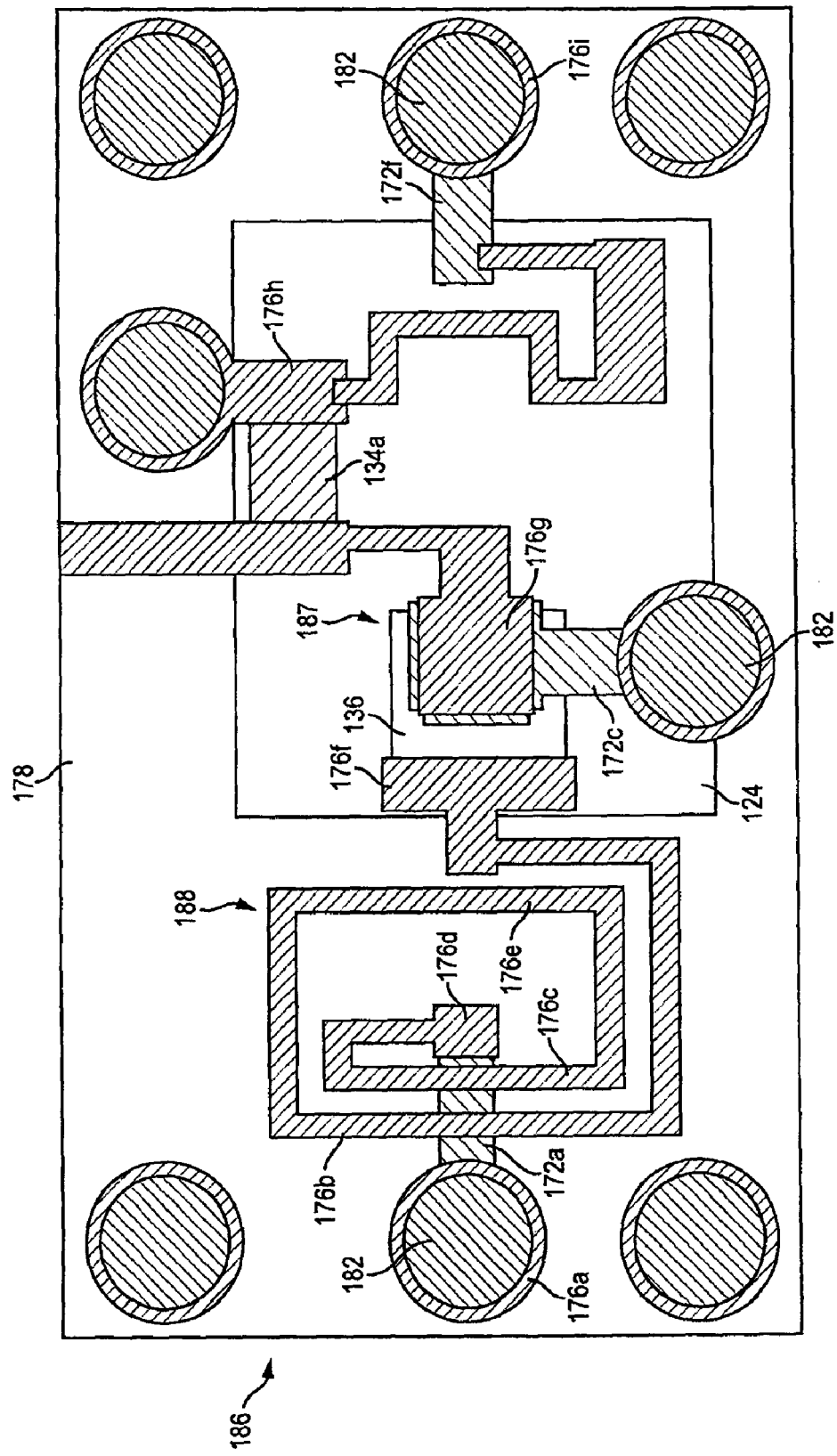
FIG. 5 illustrates a bottom view of the IPD and FO-WLCSP from FIG. 4.

The structures described in FIG. 4 constitute a plurality of passive circuit elements or IPDs. In one embodiment, conductive layer 172c and 176g, insulating layer 136, resistive layer 134b, and conductive layer 132 constitute a MIM capacitor 187. Resistive layer 134a between conductive layer 172d and 172e is a resistor element in the passive circuit. The individual sections of conductive layer 176b-176e can be wound or coiled in plan-view to produce or exhibit the desired properties of an inductor 188. FIG. 5 shows a bottom view of FO-WLCSP 186.

Figure 6:
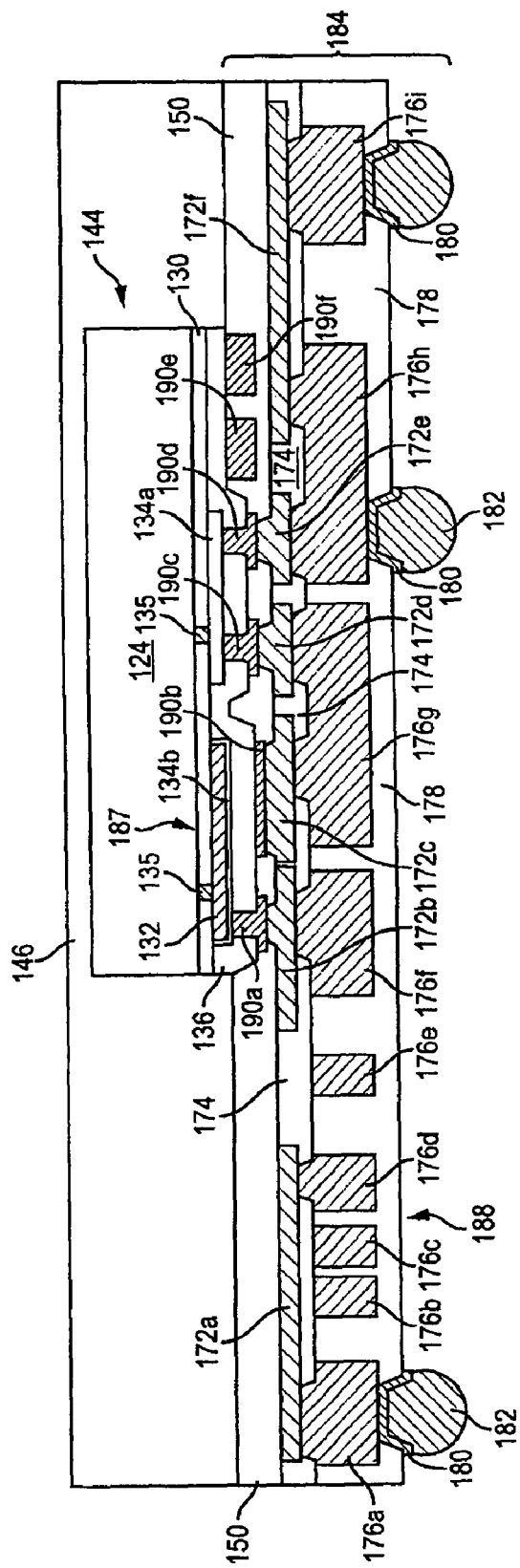
FIG. 6 illustrates a via and conductive layer formed in a dielectric layer of the MIM capacitor prior to singulation.

FIG. 6 shows an alternate embodiment similar to FIG. 4 with etching of insulating layer 136 prior to singulation. An electrically conductive layer 190 is formed in the removed portion of insulating layer 136 using patterning and PVD, CVD, sputtering, electrolytic plating, electroless plating process, or other suitable metal deposition process to form individual portions or sections 190a-190f. Conductive layer 190 can be one or more layers of Al, Cu, Sn, Ni, Au, Ag, or other suitable electrically conductive material. The individual portions of conductive layer 190a-190f can be electrically common or electrically isolated depending on the connectivity of the individual semiconductor die. For example, conductive layer 190a is electrically connected to resistive layer 134b and conductive layer 190c-190d is electrically connected to resistive layer 134a.

Figure 7:
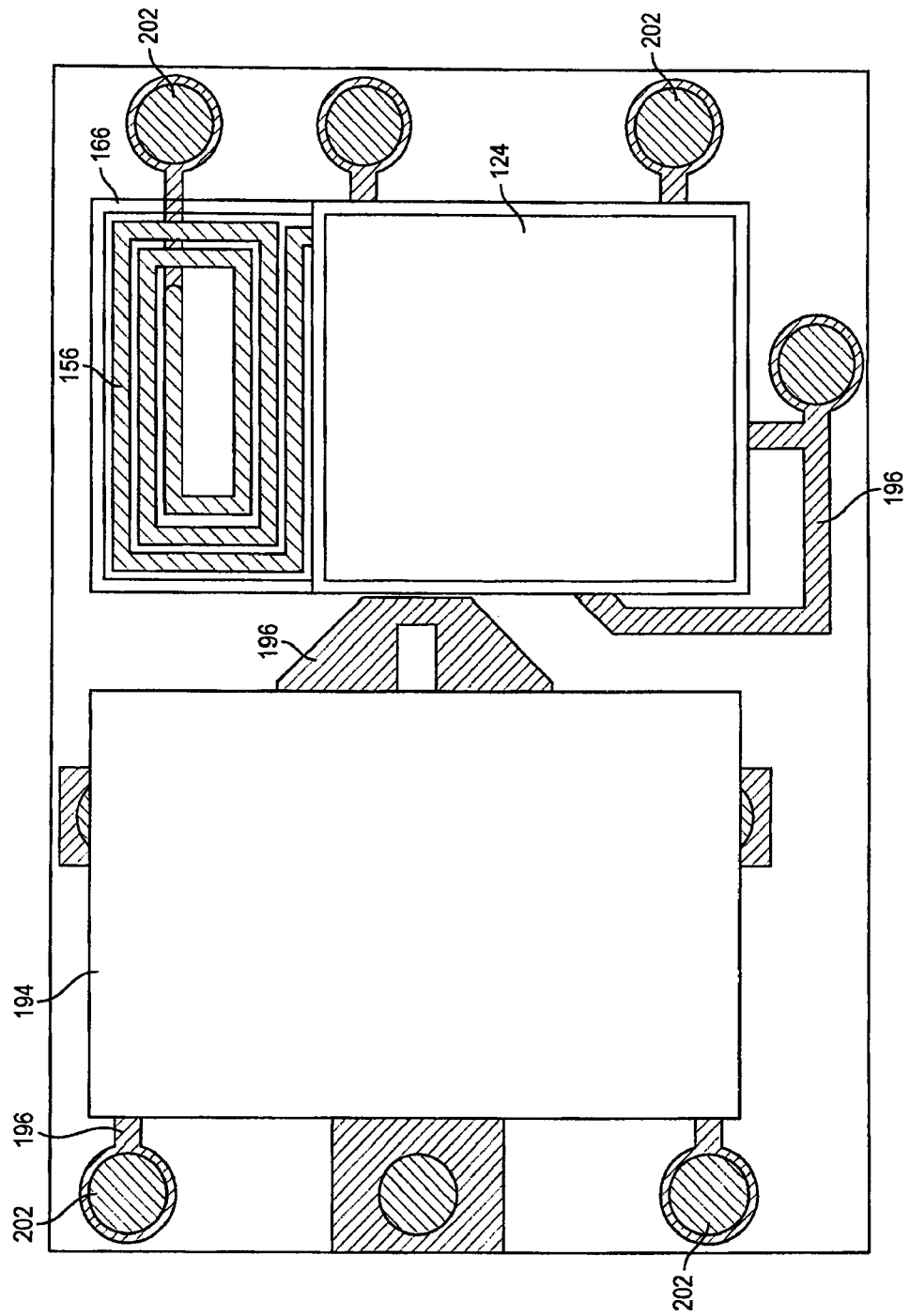
FIG. 7 illustrates side-by-side IPD die and baseband die.

FIG. 7 shows semiconductor die 194 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 124, MIM capacitor 168, and inductor 170 implemented as conductive layer 156 are electrically connected to semiconductor die 194 with traces 196. Semiconductor die 194 and WLCSP 166 are mounted side-by-side within package 200 with traces 196 routed to external pins 202. The IPD structure 168 formed over semiconductor die 124 simplifies the manufacturing process and reduces cost. The MIM capacitor 168 and resistor 134b are formed on semiconductor die 124 prior to depositing encapsulant 146. Other IPDs, such as inductor 170 are formed after encapsulation, which saves manufacturing cost by reducing the required number of lithography layers: one layer to etch back insulating layer 150 and form conductive layer 152, one layer to etch back insulating layer 154 and form conductive layer 156, and one layer to etch back insulating layer 158 and form bumps 162. In addition, by only forming MIM capacitor and resistor 134b on semiconductor die 124, and forming the aspect ratio of the gap between side-by-side IPD die and baseband die can be reduced.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer containing a plurality of semiconductor die;
   forming a first conductive layer over the semiconductor die;
   forming a resistive layer over the semiconductor die and the first conductive layer;
   forming a first insulating layer over the semiconductor die and resistive layer;
   singulating the semiconductor wafer to separate the semiconductor die;
   mounting the semiconductor die to a temporary carrier;
   depositing an encapsulant over the semiconductor die and temporary carrier;
   removing the temporary carrier and a portion of the encapsulant and first insulating layer;
   forming a second insulating layer over the encapsulant and first insulating layer;
   forming a second conductive layer over the first insulating layer and second insulating layer;
   forming a third insulating layer over the second insulating layer and second conductive layer;
   forming a third conductive layer over the third insulating layer and second conductive layer; and
   forming a fourth insulating layer over the third insulating layer and third conductive layer.

2. The method of claim 1, further including removing a portion of the encapsulant and back surface of the semiconductor die.

3. The method of claim 1, further including forming the third conductive layer over the resistive layer.

4. The method of claim 1, further including forming the second conductive layer over the resistive layer.

5. The method of claim 1, further including:
   removing a portion of the first insulating layer to expose the resistive layer prior to singulating the semiconductor wafer; and
   forming a fourth conductive layer over the resistive layer.

6. The method of claim 1, further including forming a fifth insulating layer over a surface of the semiconductor wafer prior to forming the first conductive layer and resistive layer.

7. A method of making a semiconductor device, comprising:
   providing a semiconductor wafer containing a plurality of semiconductor die;
   forming a capacitor over the semiconductor die;
   singulating the semiconductor wafer to separate the semiconductor die;
   mounting the semiconductor die to a carrier;
   depositing an encapsulant over the semiconductor die and carrier;
   removing the carrier;

forming a first insulating layer over the encapsulant and semiconductor die;

forming a first conductive layer over the first insulating layer and capacitor;

forming a second insulating layer over the first insulating layer and first conductive layer;

forming a second conductive layer over the second insulating layer and first conductive layer; and forming a third insulating layer over the second insulating layer and second conductive layer.

8. The method of claim 7, wherein forming the capacitor includes:

forming a third conductive layer over the semiconductor die;

forming a resistive layer over the semiconductor die and the third conductive layer;

forming a fourth insulating layer over the semiconductor die and resistive layer; and forming the first conductive layer over the fourth insulating layer.

9. The method of claim 8, further including:

removing a portion of the fourth insulating layer to expose the resistive layer prior to singulating the semiconductor wafer; and forming a fourth conductive layer over the resistive layer.

10. The method of claim 7, further including forming the second conductive layer over the resistive layer.

11. The method of claim 7, further including forming the first conductive layer over the resistive layer.

12. The method of claim 7, further including forming a fifth insulating layer over a surface of the semiconductor wafer prior to forming the first conductive layer and resistive layer.

13. The method of claim 7, further including forming a bump over the second conductive layer.

14. A method of making a semiconductor device, comprising:

providing a semiconductor die;

forming a capacitor over the semiconductor die;

depositing an encapsulant over the semiconductor die; and forming an interconnect structure over the encapsulant and semiconductor die, the interconnect structure including an inductor formed a predetermined distance away from a footprint of the semiconductor die; wherein forming the interconnect structure includes:

(a) forming a first insulating layer over the encapsulant and semiconductor die, (b) forming a first conductive layer over the first insulating layer and capacitor, (c) forming a second insulating layer over the first insulating layer and first conductive layer, (d) forming a second conductive layer over the second insulating layer and first conductive layer, the second conductive layer having a portion formed the predetermined distance away from the footprint of the semiconductor die and wound to operate as the inductor, and (e) forming a third insulating layer over the second insulating layer and second conductive layer.

15. The method of claim 14, wherein the portion of the second conductive layer wound to operate as the inductor is at least 50 micrometers away from the semiconductor die.

16. The method of claim 14, further including forming the second conductive layer over the resistive layer.

17. The method of claim 14, further including forming the first conductive layer over the resistive layer.

18. The method of claim 14, further including forming a bump over the second conductive layer.

19. The method of claim 14, wherein forming the capacitor includes:

forming a third conductive layer over the semiconductor die;

forming a resistive layer over the semiconductor die and the third conductive layer;

forming a fourth insulating layer over the semiconductor die and resistive layer; and forming the first conductive layer over the fourth insulating layer.

* * * * *